United States Patent
Tatum

(10) Patent No.: US 8,611,384 B2
(45) Date of Patent: Dec. 17, 2013

(54) HIGH-TEMPERATURE OPERATION OF VERTICAL CAVITY SURFACE EMITTING LASERS

(75) Inventor: Jimmy A. Tatum, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/750,801

(22) Filed: May 18, 2007

(65) Prior Publication Data
US 2007/0268943 A1 Nov. 22, 2007

Related U.S. Application Data

(60) Provisional application No. 60/801,273, filed on May 18, 2006.

(51) Int. Cl.
*H01S 3/00* (2006.01)

(52) U.S. Cl.
USPC ........... 372/38.02; 372/29.012; 372/29.015

(58) Field of Classification Search
USPC .................. 372/38.1, 38.01–38.09
See application file for complete search history.

(56) References Cited

U.S. PATENT DOCUMENTS

| | | | |
|---|---|---|---|
| 5,274,655 A | | 12/1993 | Shieh et al. |
| 5,334,826 A | * | 8/1994 | Sato et al. ............ 235/462.06 |
| 5,844,928 A | * | 12/1998 | Shastri et al. ............ 372/38.02 |
| 6,862,302 B2 | | 3/2005 | Chieng et al. |
| 7,386,020 B2 | * | 6/2008 | Chieng et al. ............ 372/29.02 |
| 2004/0101007 A1 | * | 5/2004 | Bozso et al. ............ 372/38.02 |
| 2004/0136422 A1 | * | 7/2004 | Mahowald et al. ......... 372/38.02 |
| 2005/0078722 A1 | * | 4/2005 | Wu et al. ............ 372/38.02 |
| 2005/0129075 A1 | * | 6/2005 | Anderson et al. ......... 372/38.02 |

* cited by examiner

*Primary Examiner* — Xinning Niu
(74) *Attorney, Agent, or Firm* — Maschoff Brennan

(57) ABSTRACT

Embodiments of the present invention provide a system for increasing an operational life of a VCSEL. The system can include control circuitry for reducing an amount of bias current at high temperatures and increasing a power of the laser at low temperatures. This control circuitry can further include at least one of a temperature sensor, a Field Programmable Gate Array, a read only memory module, and an electrically erasable programmable read only memory module (EEPROM). In alternate embodiments, the control circuitry can further include a lookup table that sets the bias current depending on a temperature of the laser. The laser can be part of an optoelectronic transceiver module which can include, by way of example and not limitation, SFP, XFP, X2, XAUI, XENPAK, XPAK, GBIC, 8G, 16G, and other optoelectronic modules.

20 Claims, 8 Drawing Sheets

HIGH-TEMPERATURE OPERATION OF VERTICAL CAVITY SURFACE EMITTING LASERS

CROSS-REFERENCE TO RELATED APPLICATIONS

This application claims benefit to U.S. Provisional Application Ser. No. 60/801,273, filed on May 18, 2006, which is incorporated herein.

BACKGROUND OF THE INVENTION

1. The Field of the Invention

Exemplary embodiments of the present invention relate to the field of vertical cavity surface emitting lasers (VCSELs) and, more specifically, to devices and methods to increase the reliability of VCSELs at higher temperatures.

2. The Relevant Technology

In the field of data transmission, one method of efficiently transporting data is through the use of fiber optics. Digital data is propagated through a fiber optic cable using light emitting diodes or lasers. Light signals allow for extremely high transmission rates and very high bandwidth capabilities. Also, light signals are resistant to electro-magnetic interferences that would otherwise interfere with electrical signals. Light signals are more secure because they do not allow portions of the signal to escape from the fiber optic cable as can occur with electrical signals in wire-based systems. Light also can be conducted over greater distances without the signal loss typically associated with electrical signals on copper wire.

Light signals are transmitted using a laser diode, a laser driver, and various other electrical circuitry. The transmitter receives electrical signals representing network or communication data and processes the electrical signals to achieve the result of modulating the network or communication data onto an optical signal generated by the laser driver and the associated laser.

To operate correctly, the laser diode of the transmitter is supplied with both a controlled direct current (DC) bias current and an alternating current (AC) modulation current. The DC bias current allows the laser diode to properly respond to the AC modulation. At a given temperature, a given DC bias current will produce a given optical power output for the laser. This bias current needs to provide an AC current that is at least above a threshold current level, which is the lowest excitation level at which laser output is dominated by stimulated emission rather than by spontaneous emission. However, for this given DC bias current, the optical power output will change as the temperature of the components changes.

Unfortunately, it is often necessary to compensate for these changes in optical power through some form of control network. A common method for doing this is to use a monitor photodiode that samples the optical output power as part of a control loop. The control loop can then adjust the DC bias current going to the laser to keep a constant amount of optical power output coming from the laser and going to the photodiode. This system is referred to as an average power control (APC) control loop. It compensates for both changes in the laser threshold current and slope efficiency.

As data speeds have increased to the 10 Gigabit/second standard, the requirement to operate the laser over an extended temperature range has also increased. These higher speeds produce additional problems. For a given laser design, the speed of the laser is proportional to the square root of the current above the threshold level. Thus, in order to get the most speed from the laser, it is desirable to drive the laser with a large amount of current. Unfortunately, the reliability of the laser decreases proportionally to the square of the current. Additionally, the reliability of the laser decreases exponentially as the temperature increases.

The above described relationships are shown graphically in FIG. 1, which is designated generally as reference numeral 10. Graph 10 includes a relative current scale 12 on the bottom. Relative current is defined as the current applied to the laser, I, minus the threshold current, $I_{th}$, divided by $I_{th}$. The right side of the graph shows the resonance frequency of the laser 14, which corresponds to the speed of the laser. The left hand side of the graph shows the Mean Time to Failure (MTTF) 16 in hours.

A first plot line 18 illustrates the relationship between current and laser speed. As the current increases, the speed of the laser increases as well. Lines 20, 22, and 24 represent the relationship between speed and reliability at temperatures of 0, 40 and 80° C., respectively. Note that, as the temperature and current increase, the reliability of the laser decreases significantly.

This relationship is somewhat more complicated for vertical cavity surface emitting lasers (VCSELs). Vertical cavity surface emitting lasers (VCSELs) represent a relatively new class of semiconductor lasers. While there are many VCSEL variations, a common characteristic is that VCSELs emit light perpendicular to a semiconductor wafer's surface. Advantageously, VCSELs can be formed from a wide range of material systems to produce specific characteristics.

VCSELs include, among other things, semiconductor active regions, distributed Bragg reflector (DBR) mirrors, current confinement structures, substrates, and contacts. Because of their complicated structure, and because of their specific material requirements, VCSELs are usually grown using metal-organic chemical vapor deposition (MOCVD) or molecular beam epitaxy (MBE). Specific details concerning the construction of a typical VCSEL are known to those of skill in the art. However, for the sake of clarity, a brief discussion of a typical VCSEL structure is provided below with reference to FIG. 2.

FIG. 2 illustrates a typical long-wavelength VCSEL 110. As shown, an n-doped Indium Phosphide (InP) substrate 112 has an n-type electrical contact 114. An n-doped lower mirror stack 116 (a Distributed Bragg Reflector (DBR)) is on the InP substrate 112, and an n-type graded-index InP lower spacer 118 is disposed over the lower mirror stack 116. An indium gallium arsenide phosphide (InGaAsP) or aluminum indium gallium arsenide (AlInGaAs) active region 120, usually having a number of quantum wells, is formed over the InP lower spacer 118. Over the active region 120 is an insulating region 140 that provides current confinement. The insulating region 140 is usually formed either by implanting protons or by forming an oxide layer. In any event, the insulating region 140 defines a conductive annular central opening 142 that forms an electrically conductive path though the insulating region 140. Over the insulating region is a tunnel junction 128. Over the tunnel junction 128 is an n-type graded-index InP top spacer 122 and an n-type InP top mirror stack 124 (another DBR), which is disposed over the InP top spacer 122. Over the top mirror stack 124 is an n-type conduction layer 109, an n-type cap layer 108, and an n-type electrical contact 126.

Still referring to FIG. 2, the lower spacer 118 and the top spacer 122 separate the lower mirror stack 116 from the top mirror stack 124 such that an optical cavity is formed. As the optical cavity is resonant at specific wavelengths, the mirror separation is controlled to resonate at a predetermined wavelength (or at a multiple thereof).

In operation, the external bias current discussed above causes an AC electrical current 121 to flow from the electrical contact 126 toward the electrical contact 114. The tunnel junction over the insulating region 140 converts incoming electrons into holes. The converted holes are injected into the insulating region 140 and the conductive central opening 142, both of which confine the current 121 such that the current flows through the conductive central opening 142 and into the active region 120. Some of the injected holes are converted into photons in the active region 120. Those photons bounce back and forth (resonate) between the lower mirror stack 116 and the top mirror stack 124. While the lower mirror stack 116 and the top mirror stack 124 are very good reflectors, some of the photons leak out as light 123 that travels along an optical path. The light 123 passes through the conduction layer 109, the cap layer 108, an aperture 130 in electrical contact 126, and out of the surface of the vertical cavity surface emitting laser 110.

It should be understood that FIG. 2 illustrates a typical long-wavelength VCSEL having a tunnel junction, and that numerous variations are possible. For example, the dopings can be changed (say, by providing a p-type substrate), different material systems can be used, operational details can be tuned for maximum performance, and additional structures and features can be added.

In a typical VCSEL, such as the one discussed above, the relationship between the applied bias current and the speed of the laser is more complex due to the multi-transverse mode nature of the device. Generally, one can observe differences in the modulation characteristics as a function of temperature, and more specifically, depending on which side of the "T-zero" ($T_0$) point the laser is operated. The $T_0$ point is the temperature at which the threshold current is a minimum over temperature. Also, the slope efficiency (amount of light output increase for a given increase in drive current) can affect the modulation performance.

FIG. 3 illustrates one example, designated generally as reference numeral 30, of the variation of threshold current 32 and slope efficiency 34 over temperature 36 in a typical VCSEL. A first plot line 38 represents the variation of threshold current as a function of temperature. A second plot line 40 represents the variation of slope efficiency over temperature. As can be seen from the plot line 40, in a VCSEL, the slope efficiency decreases with increasing temperature.

When operated in a constant optical power mode, the VCSEL 100 described here would have the operational characteristics shown in a graph 50 illustrated in FIG. 4. The graph 50 includes a temperature scale 52, a relative laser speed 54, and a measure of the bias current 56. A first curve 58 illustrates the relative speed of the laser as the temperature increases. A second curve 60 illustrates the bias current needed to maintain a constant power output as the temperature increases. As can be clearly seen in curve 58, as the temperature decreases, the optical performance is degraded due to a reduction in speed. Similarly, at high temperature, the reliability of the VCSEL is compromised due to the increase in the bias current, as shown in curve 60. As can be seen from the graph in FIG. 4, using an APC control loop for VCSEL 100 requires a very high bias current at higher speeds and higher temperatures. Unfortunately, at these higher temperatures, the reliability of the VCSEL is severely compromised due to the increase in the bias current.

BRIEF SUMMARY OF THE EMBODIMENTS

In a more useful application, the speed of the laser would be flattened as a function of temperature, and the biasing current would be reduced at the higher temperatures. Embodiments of the present invention set forth here accomplish this task by allowing the designer to set the modulation and bias currents at each temperature to simultaneously meet the eye safety and performance requirements, such as, by way of example, the eye mask margin.

One embodiment of the present invention provides a system for increasing an operational life of a VCSEL. The system can include control circuitry for reducing an amount of bias current at high temperatures and increasing a power of the laser at low temperatures. This control circuitry can further include at least one of a temperature sensor, a Field Programmable Gate Array, a read only memory module, and an electrically erasable programmable read only memory module (EEPROM). In alternate embodiments, the control circuitry can further include a lookup table that sets the bias current depending on a temperature of the laser. The system can be most effective for laser devices that are operated at a speed of about 3 Gigabits per second (Gb/s) or greater. Such devices can include, by way of example and not limitation, SFP, XFP, X2, XAUI, XENPAK, XPAK, GBIC, 8G, 16G, and other optoelectronic modules. The control circuitry can be contained within the transmitter optical sub-assembly, integrated within the module itself, or provided as a part of a host system or other control system that is completely external to the module.

An alternate embodiment of the present invention provides a method for increasing a reliability of a vertical cavity surface emitting laser. The method can include steps for reducing an amount of a bias current over a high temperature range and increasing an amount of the laser power over a low temperature range. In some embodiments, the reducing and increasing steps can be accomplished using control circuitry that is external to the laser. The control circuitry can include at least one of a temperature sensor, a Field Programmable Gate Array, a read only memory module, and an electrically erasable programmable read only memory module. In alternate embodiments, the control circuitry can include a lookup table that sets the bias current depending on a temperature of the laser.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EMBODIMENTS

Embodiments of the present invention provide systems and methods that use a memory, microprocessor, thermistor, or other means to reduce the amount of bias current (optical power) at high temperatures and increase the current (power) at low temperatures to increase device reliability and improve the AC performance over temperature. These embodiments of systems and methods increase the reliability of the laser while simultaneously maintaining the laser performance requirements at higher temperatures using less optical power. These embodiments increase the reliability of the laser without compromising the operational characteristics of the laser, such as, but not limited to, eye safety requirements and eye mask margin.

One way to measure the operational characteristics of a laser is to use an eye diagram. An eye diagram of a signal overlays the signal waveform over many cycles. Each cycle waveform is aligned to a common timing reference, typically a clock. An eye diagram provides a visual indication of the voltage and timing uncertainty associated with the signal. It can be generated by synchronizing an oscilloscope to a timing reference. The vertical thickness of the lines in an eye diagram indicate the magnitude of AC voltage noise, whereas the horizontal thickness of the lines where they cross over is an indication of the AC timing noise or jitter. Fixed DC voltage and timing offsets are indicated by the position of the eye on the screen. The size of the eye opening in the center of an eye diagram indicates the amount of voltage and timing margin available to sample the signal. Thus, for a particular electrical interface, a fixed reticule or window could be placed over the eye diagram showing how the actual signal compares to a minimum criteria window, known as the eye mask. If a margin rectangle with width equal to the required timing margin and height equal to the required voltage margin fits into the opening, then the signal has adequate margins. Voltage margin can often be traded off for timing margin.

Figure 1:
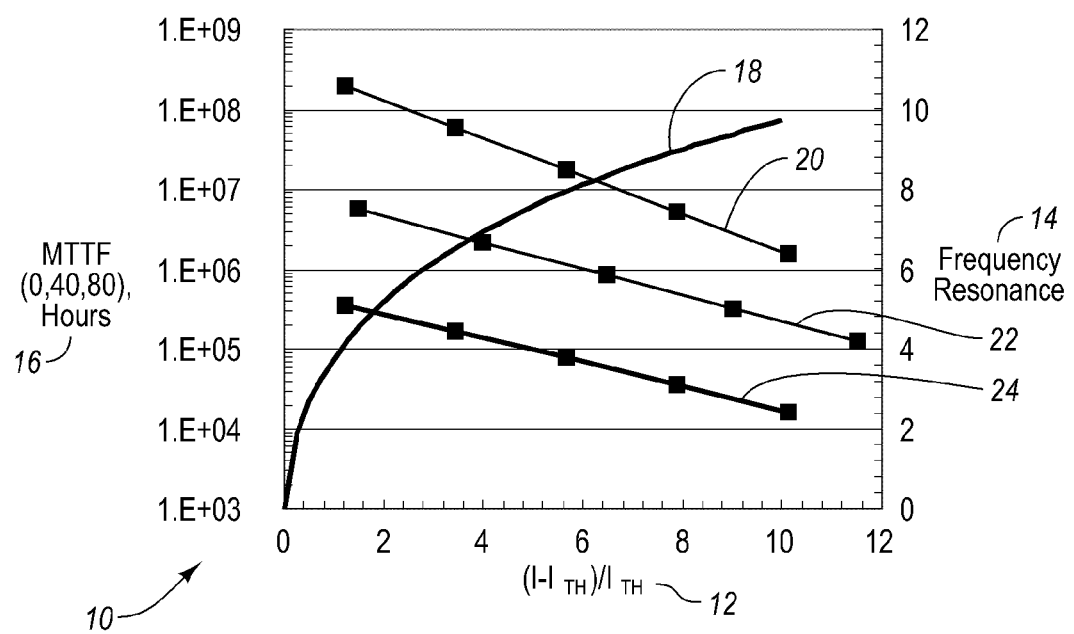
FIG. 1 illustrates the general relationship between speed and reliability for a laser.
Figure 2:
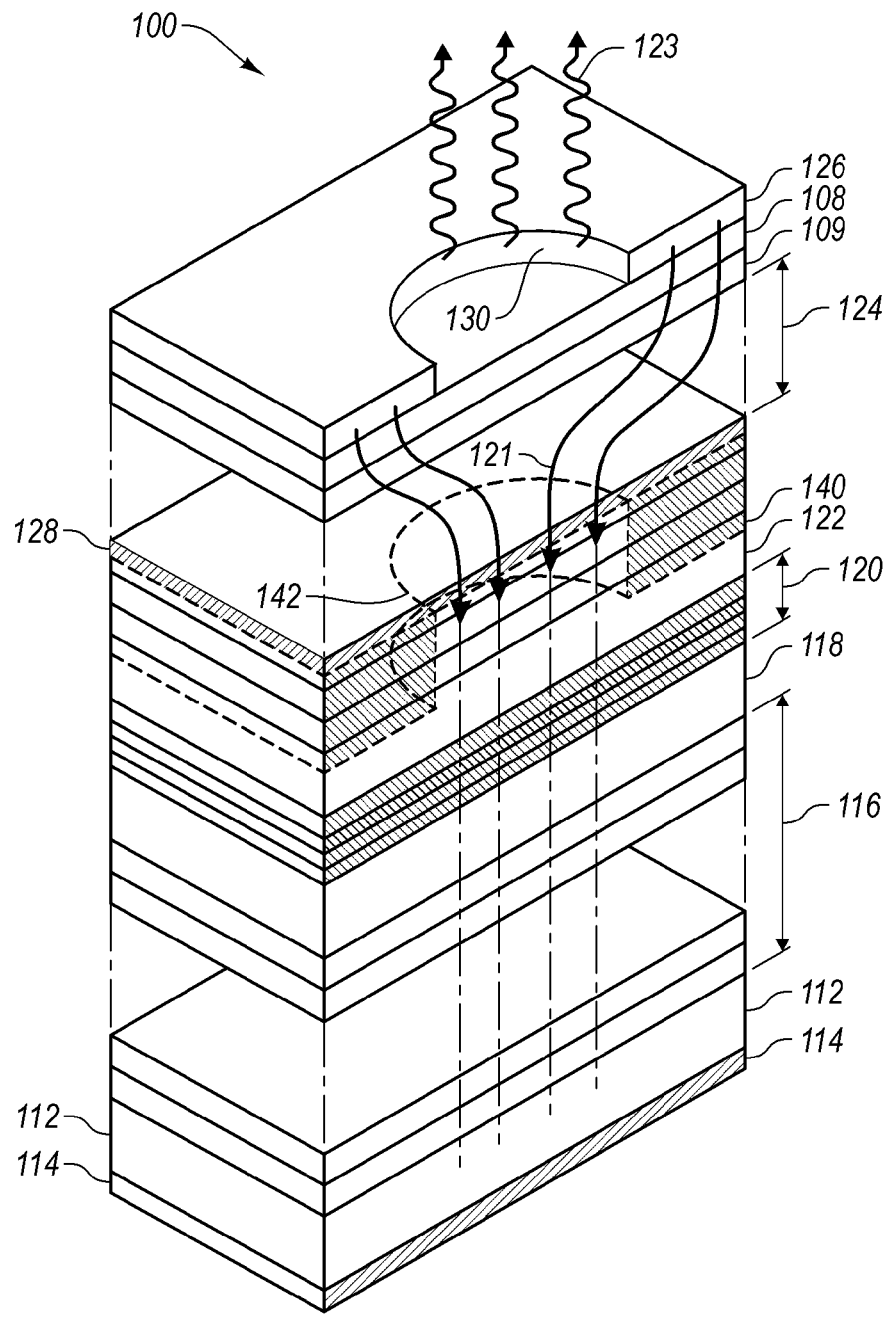
FIG. 2 illustrates one embodiment of a VCSEL that can be used with embodiments of the present invention.
Figure 3:
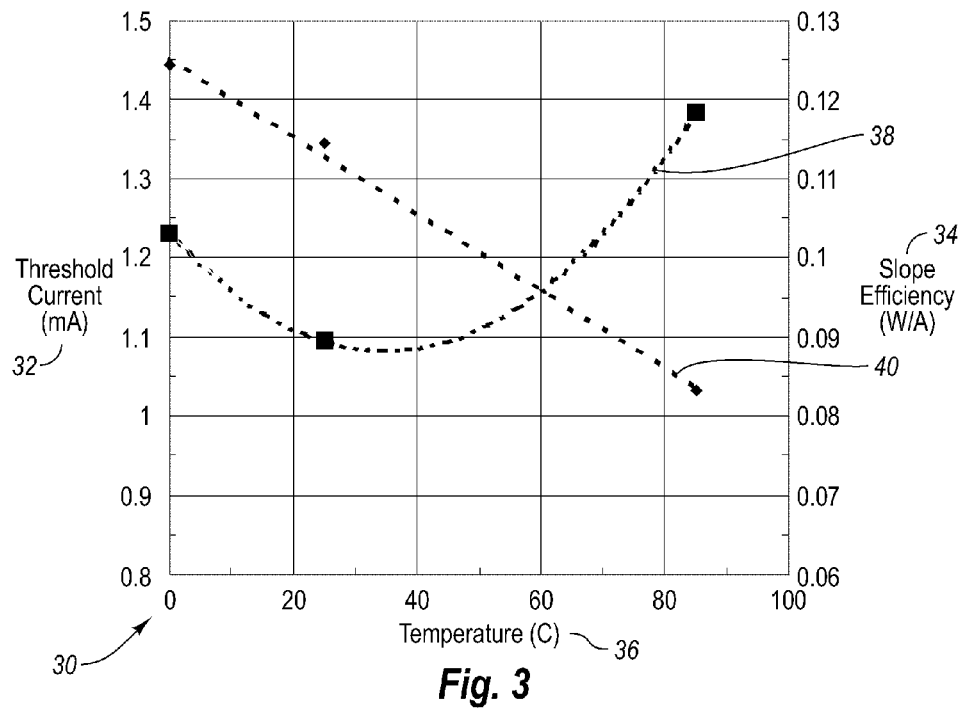
FIG. 3 illustrates the variation between threshold current and slope efficiency for a VCSEL.
Figure 4:
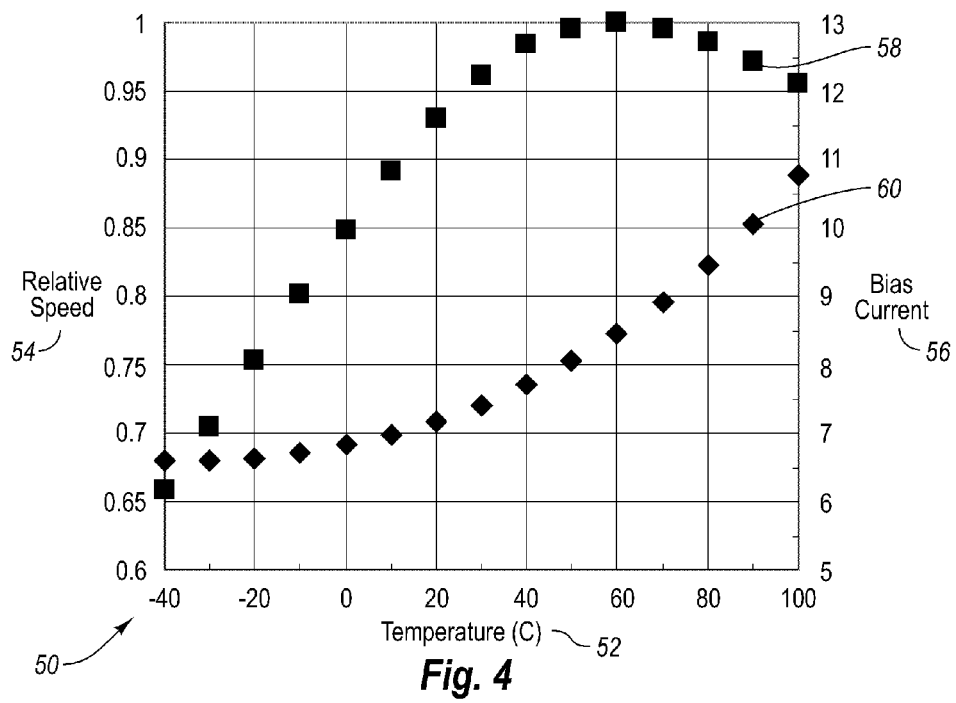
FIG. 4 illustrates the relationship between speed, bias current and temperature in a VCSEL.
Figure 5A:
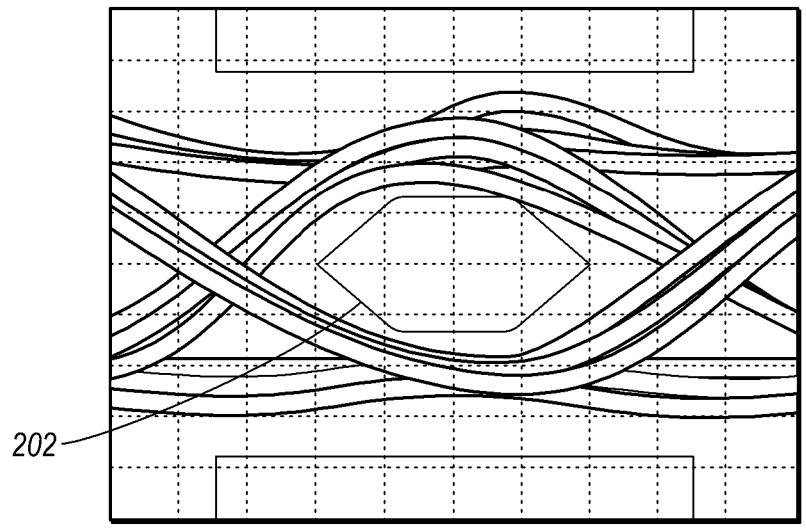
FIGS. 5A-5D illustrate eye diagrams for a VCSEL operated at various temperatures.
Figure 5B:
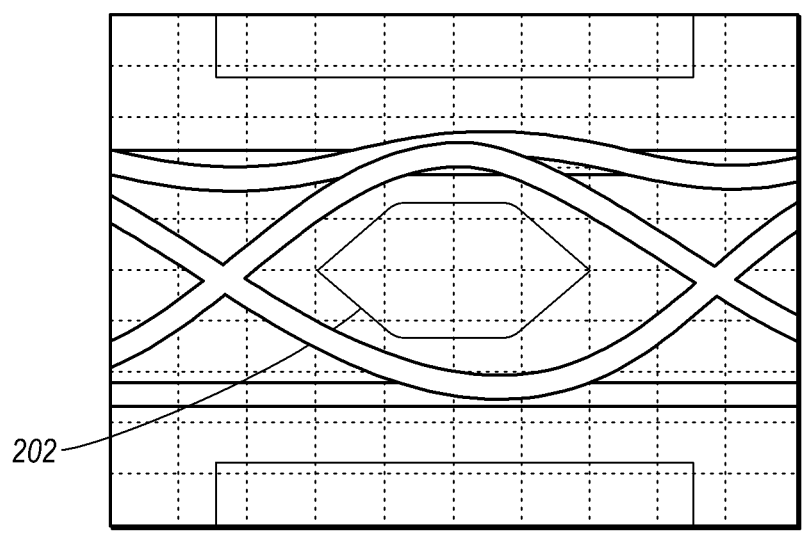
Figure 5C:
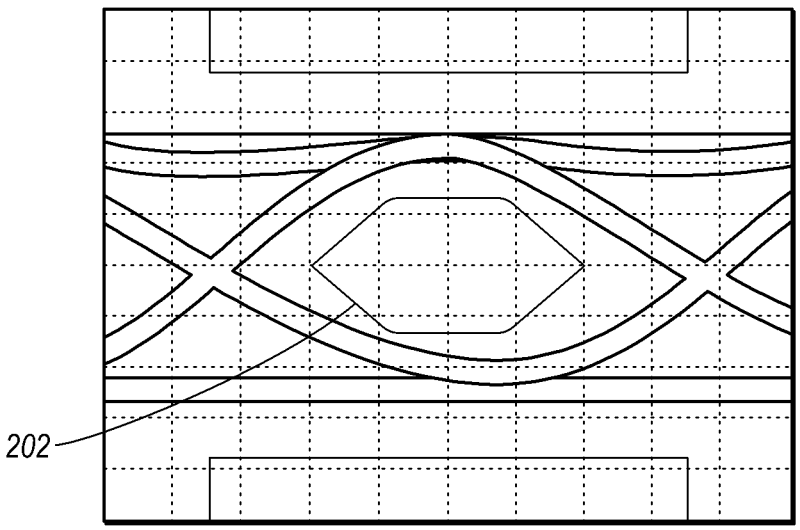
Figure 5D:
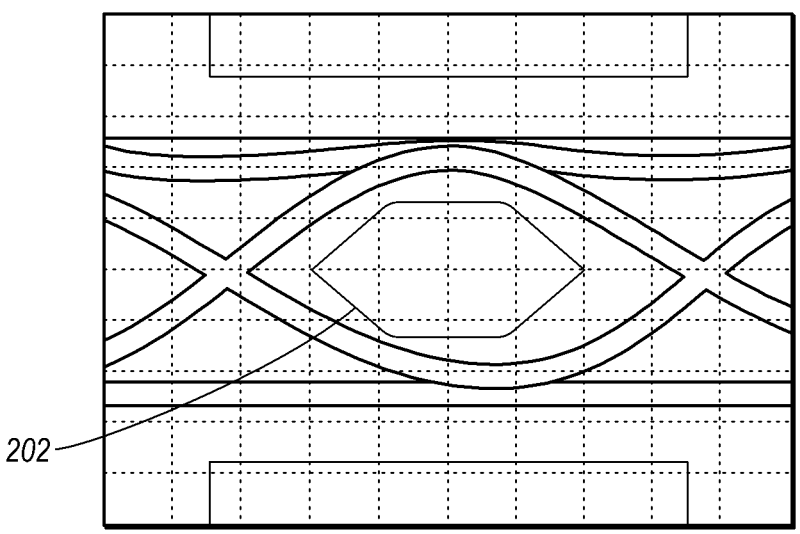

Examples of eye diagrams for a typical high speed VCSEL are shown in FIGS. 5A-5D. FIG. 5A illustrates an eye diagram 200 for the VCSEL operated at minus 30° C., while FIGS. 5B-5D illustrate the same eye diagram 200 when the VCSEL is operated at minus 10° C., 35° C. and 85° C., respectively. The eye is shown as reference numeral 202 in each diagram. Average power and optical modulation amplitude (OMA) was maintained across temperature. The eye closure at low temperature is caused by the decrease in the relaxation oscillation frequency (ROF) as a function of laser bias. Using pulse mode measurements, the ROF of the VCSEL was measured across temperature and laser current in both the data "ones" and the data "zeroes."

Figure 6:
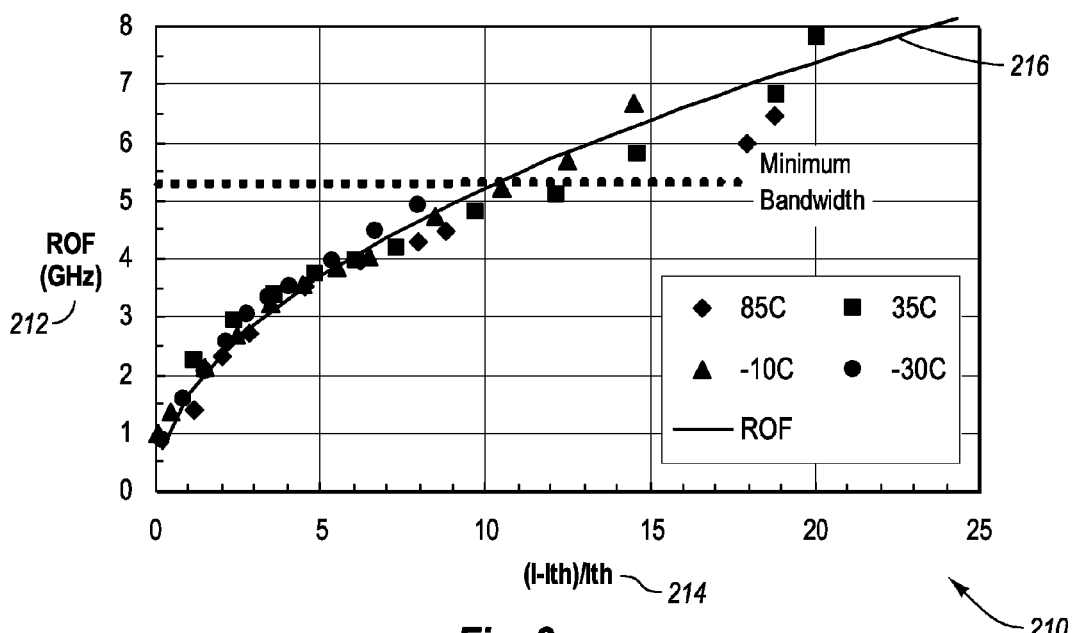
FIG. 6 illustrates the dependence of the resonance oscillation frequency as a function of bias current and temperature.

Results or the measurements are shown as a graph in FIG. 6, and designated generally as reference numeral 210. Graph 210 illustrates an ROF 212 plotted as a function of current $((I-I_{TH})/I_{TH})$ 214 over multiple temperatures. The ROF for a given current is illustrated as line 214. The conclusion is that this VCSEL must be operated at currents in the range of ten times threshold to achieve sufficient eye quality, and that the requirement expressed as the ratio of above-threshold current to threshold current is independent of temperature. As the operating temperature is lowered, the laser efficiency is increased, forcing the laser to operate closer to threshold in an APC circuit, causing the ROF to decrease until it comes in band of the electrical signal.

One of the unique features of VCSELs is the AC operation over temperature, particularly with respect to the $T_0$ point (the point where the minimum threshold current occurs as a function of temperature). Two simple measures of the optical performance are the overshoot in the eye diagram, and in the amount of jitter. These are illustrated in FIGS. 7 and 8 discussed below.

Figure 7:
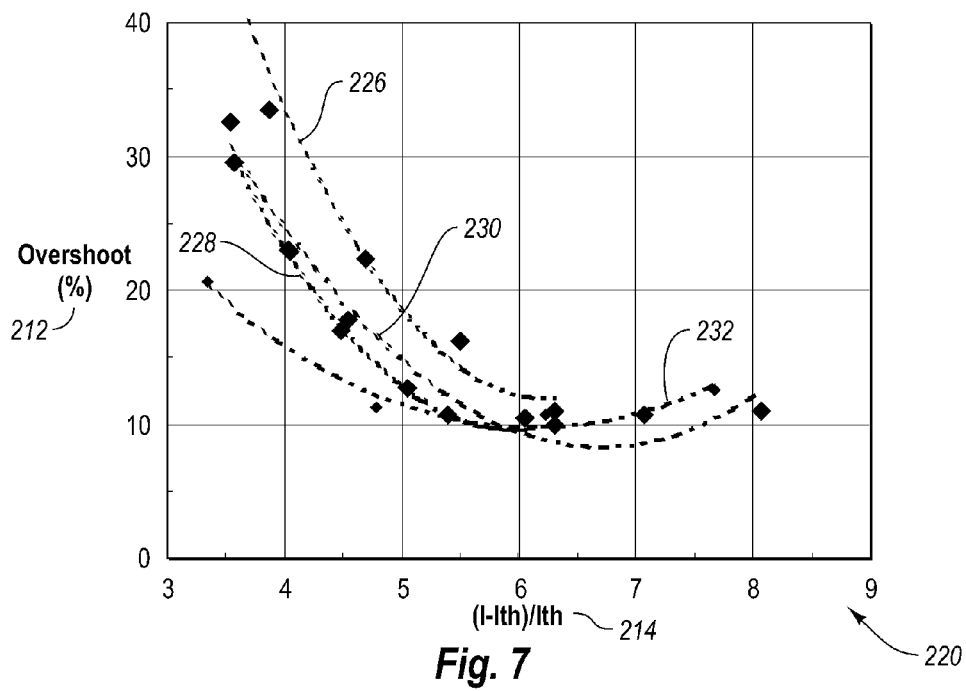
FIG. 7 illustrates the relationship between the overshoot in the eye diagram and the bias current as a function of temperature.

FIG. 7 illustrates a graph 220 showing the overshoot 222 in the eye diagram as a function of the current input 224 into the laser for a range of temperatures. Overshoot can be defined as a phenomenon where a signal rises to a level greater than its steady-state voltage before settling to its steady-state voltage. Specific plots for a temperature of 0° C., shown as curve 226, 25° C., shown as curve 228, 50° C., shown as curve 230, and 85° C., shown as curve 232 are illustrated on graph 220.

Figure 8:
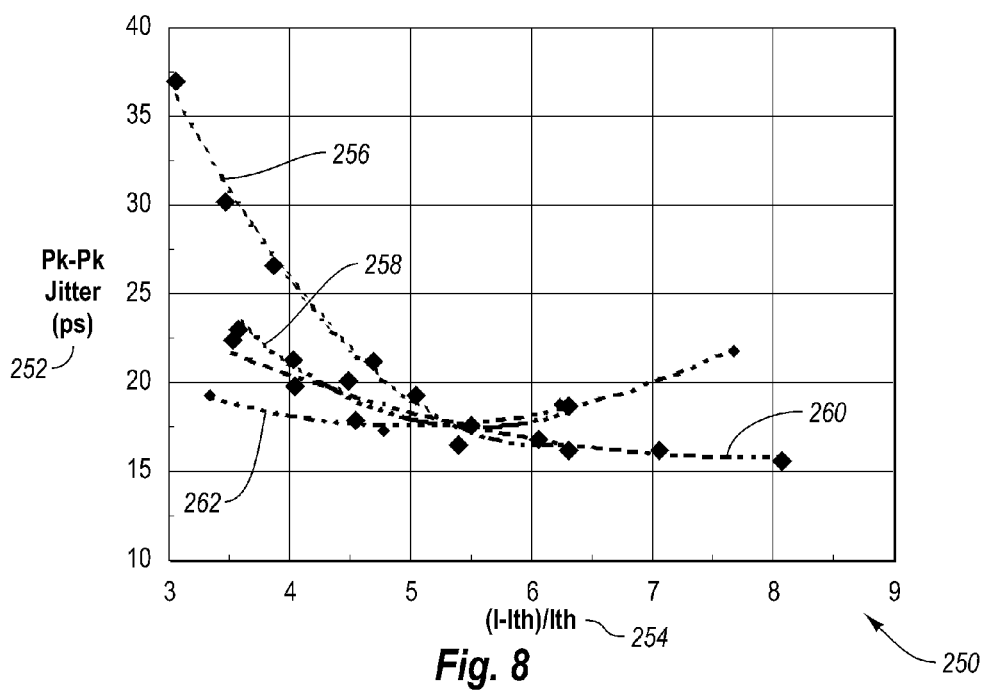
FIG. 8 illustrates the relationship between the peak to peak jitter and the bias current as a function of temperature.

FIG. 8 illustrates a graph 250 showing jitter 252 as a function of the current input 254 into the laser for a range of temperatures. Specific plots for a temperature of 0° C., shown as curve 256, 25° C., shown as curve 258, 50° C., shown as curve 260, and 85° C., shown as curve 262 are illustrated on graph 250.

As can be seen in FIGS. 7 and 8 above, it is not necessary to drive a VCSEL as far above threshold to achieve a particular performance level as the temperature is increased. Embodiments of the present invention take advantage of the fact that one does not need to drive the VCSEL so far above threshold to achieve acceptable performance, which has the double benefit of increasing the reliability at high temperature. The embodiments abandon average power control, and use, by way of example and not limitation, control circuitry that includes a memory, microprocessor, thermistor, or other means to reduce the amount of bias current (optical power) at high temperatures and increase the current (power) at low temperatures to increase device reliability and improve the AC performance over temperature.

In some embodiments, the control circuitry can be integrated into a transmitter optical subassembly (TOSA). In alternate embodiments, the control circuitry can integrated into an optoelectronic module that includes a laser transmitter. Such modules can include, by way of example and not limitation, SFP, XFP, X2, XAUI, XENPAK, XPAK, GBIC, 8G, 16G, and other optoelectronic modules. In still other embodiments, the control circuitry can be external to the laser, the TOSA, or the module itself. Similarly, lasers that can use the embodiments of the present invention can be operated in ranges from about 2 gigabits per second (Gb/s) to about 15 Gb/s or higher.

In some embodiments, the control circuitry can include one or more of a temperature sensor, a Field Programmable Gate Array (FPGA), a read only memory module, and an electrically erasable programmable read only memory module (EEPROM). In some embodiments, the control circuitry can include a temperature measuring device and a look-up table of specific bias current values depending on temperature. One example of such a look-up table is provided below as Table 1.

TABLE 1

Lookup Table

| Temperature (° C.) | Laser Bias (mA) |
| --- | --- |
| −30 | 6.5 |
| −25 | 6.45 |
| −20 | 6.4 |
| −15 | 6.35 |
| −10 | 6.35 |
| −5 | 6.4 |
| 0 | 6.45 |
| 5 | 6.6 |
| 10 | 6.7 |
| 15 | 6.8 |
| 20 | 6.9 |
| 25 | 7 |
| 30 | 7.2 |
| 35 | 7.4 |
| 40 | 7.8 |
| 45 | 8.2 |
| 50 | 8.6 |
| 55 | 9 |
| 60 | 9.5 |
| 65 | 10 |
| 70 | 10.5 |
| 75 | 10.5 |
| 80 | 10.5 |
| 85 | 10.5 |

Figure 9:
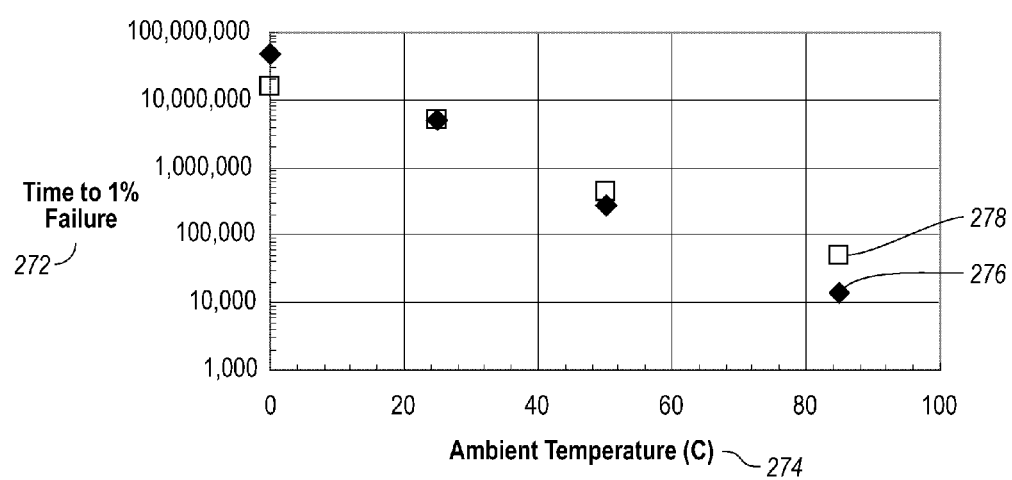
FIG. 9 illustrates the time to 1% failure as a function of temperature for VCSELs operated according to the present invention.

The embodiments of the present invention discussed above can provide greatly enhanced reliability for VCSELs, particularly when they are operated at the higher temperatures characteristic of today's operating environment. This can be seen in the graph shown in FIG. 9, and designated generally as reference numeral 270. The graph 270 illustrates the time to 1 percent failure 272 plotted as a function of the ambient temperature 274. A series of diamonds 276 illustrates the time to 1 percent failure using the prior art method of APC, while a series of squares 278 illustrates the time to 1 percent failure for embodiments of the present invention. As can be seen, the inventive system and method allow for an almost 5 fold increase in the time to failure when the laser device is operated at temperatures above 80° C.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for operating an optoelectronic transceiver having a vertical cavity surface emitting laser, the method comprising:
    providing a plurality of bias current values, each of the bias current values corresponding to an operating environment temperature falling within a predefined temperature range, wherein:
        the predefined temperature range comprises a first lower temperature range and a second higher temperature range; and
        each of the bias current values corresponding to each of the operating environment temperatures in the second higher temperature range is constant; and
    providing a bias current to the laser having a value that corresponds to the operating environment temperature.

2. A method according to claim 1, wherein the method does not use average power control for providing the bias current to the vertical cavity surface emitting laser.

3. A method according to claim 1, wherein the first lower temperature range includes between about a negative 10 degrees Celsius and a positive 65 degrees Celsius and the second higher temperature range includes temperatures higher than 65 degrees.

4. A method according to claim 3, wherein the bias current values in the first lower temperature range increase at least 0.02 mA for every five degrees Celsius temperature increase.

5. A method according to claim 1, further comprising a third temperature range even lower than the first lower temperature range.

6. A method according to claim 5, wherein the bias current value associated with each temperature in the third temperature range increases with a decrease in temperature.

7. A method according to claim 6, wherein the bias current value associated with each temperature in the third temperature range increases by at least 0.02 mA for each five degree decrease in associated temperature in the third temperature range.

8. A method according to claim 1, wherein the optical power control of the vertical cavity surface emitting laser is different when the temperature of the vertical cavity surface emitting laser is operated at temperatures within the first lower temperature range then within the second higher temperature range.

9. A method for operating an optoelectronic transceiver having a vertical cavity surface emitting laser, the method comprising:
    providing a plurality of bias current values, each of the bias current values corresponding to an operating environment temperature falling within a predefined temperature range, wherein;
        the predefined temperature range comprises a first lower temperature range and a second higher temperature range;
        each of the bias current values corresponding to each of the operating environment temperatures in the second higher temperature range is constant over the second higher temperature range; and
        each of the bias current values corresponding to each of the operating environment temperatures in the first lower temperature range decrease with a corresponding increase in temperature; and
    providing a bias current to the laser having a value that corresponds to the operating environment temperature.

10. A method according to claim 9, further comprising a third temperature range between the first lower temperature range and the second higher temperature range.

11. A method according to claim 10, wherein the bias current values corresponding to each of the operating environment temperatures in the third temperature range increase with a corresponding increase in temperature.

12. A method according to claim 11, wherein the first lower temperature range includes temperatures below about minus 15 degrees Celsius, the third temperature range includes temperatures between about minus 10 degrees Celsius and about positive 65 degrees Celsius, and the second higher temperature range includes temperatures higher than 70 degrees Celsius.

13. A method according to claim 12, wherein the first lower temperature range and corresponding bias current values include 6.5 mA at minus 30 degrees Celsius, 6.45 mA at minus 25 degrees Celsius, 6.4 mA at minus 20 degrees Celsius, and 6.35 mA at minus 15 degrees Celsius.

14. A method according to claim 12, wherein the third temperature range and corresponding bias current values include 6.35 mA at minus 10 degrees Celsius, 6.4 mA at minus 5 degrees Celsius, 6.45 mA at minus 0 degrees Celsius, and 6.6 mA at positive 5 degrees Celsius.

15. A method according to claim 14, wherein the third temperature range and corresponding bias current values further include 6.7 mA at positive 10 degrees Celsius, 6.8 mA at positive 15 degrees Celsius, 6.9 mA at positive 20 degrees Celsius, and 7 mA at positive 25 degrees Celsius.

16. A method according to claim 15, wherein the third temperature range and corresponding bias current values further include 7.2 mA at positive 30 degrees Celsius, 7.4 mA at positive 35 degrees Celsius, 7.8 mA at positive 40 degrees Celsius, and 8.2 mA at positive 45 degrees Celsius.

17. A method according to claim 16, wherein the third temperature range and corresponding bias current values further include 8.6 mA at positive 50 degrees Celsius, 9 mA at positive 55 degrees Celsius, 9.5 mA at positive 60 degrees Celsius, and 10 mA at positive 65 degrees Celsius.

18. A method according to claim 12, wherein the second higher temperature range and corresponding bias current values include about 10.5 mA at positive 70, 75, 80, and 85 degrees Celsius.

19. A method according to claim 9, wherein the method does not use average power control for providing the bias current to the vertical cavity surface emitting laser.

20. A method for operating an optoelectronic transceiver having a vertical cavity surface emitting laser, the method comprising:
providing a plurality of bias current values, each of the bias current values corresponding to an operating environment temperature falling within a predefined temperature range, wherein:
the predefined temperature range comprises a first lowest temperature range, a second middle temperature range, and a third higher temperature range;
each of the bias current values corresponding to each of the operating environment temperatures in the first lowest temperature range decreases with a corresponding increase in temperature;
each of the bias current values corresponding to each of the operating environment temperatures in the second middle temperature range increases with a corresponding increase in temperature; and
each of the bias current values corresponding to each of the operating environment temperatures in the third higher temperature range is the same with corresponding increase in temperature; and
providing a bias current to the laser having a value that corresponds to the operating environment temperature.

* * * * *